United States Patent
Pitts et al.

(10) Patent No.: US 6,735,146 B2
(45) Date of Patent: May 11, 2004

(54) SYSTEM AND METHOD FOR PULLING ELECTRICALLY ISOLATED MEMORY CELLS IN A MEMORY ARRAY TO A NON-FLOATING STATE

(75) Inventors: Robert L. Pitts, Dallas, TX (US); David Toops, Terrell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 50 days.

(21) Appl. No.: 10/241,072

(22) Filed: Sep. 10, 2002

(65) Prior Publication Data

US 2004/0047175 A1 Mar. 11, 2004

(51) Int. Cl.[7] .................................................. G11C 7/00
(52) U.S. Cl. .......................... 365/230.06; 365/230.03; 365/230.08; 365/189.09; 365/206; 365/214
(58) Field of Search ...................... 365/230.06, 230.03, 365/230.08, 206, 214, 189.09

(56) References Cited

U.S. PATENT DOCUMENTS

| | | | | |
|---|---|---|---|---|
| 4,360,901 A | * | 11/1982 | Proebsting | 365/230.06 |
| 5,428,577 A | * | 6/1995 | Yumitori et al. | 365/203 |
| 6,028,793 A | * | 2/2000 | Manstretta et al. | 365/185.23 |
| 6,385,091 B1 | * | 5/2002 | Pekny | 365/185.2 |
| 6,603,683 B2 | * | 8/2003 | Hsu et al. | 365/189.04 |
| 2003/0043677 A1 | * | 3/2003 | Marr | 365/226 |
| 2003/0210566 A1 | * | 11/2003 | Yamagami | 365/154 |

FOREIGN PATENT DOCUMENTS

JP    402079469 A   *   3/1990   ............ H01L/27/11

* cited by examiner

Primary Examiner—Viet Q. Nguyen
(74) Attorney, Agent, or Firm—Alan K. Stewart; W. James Brady, III; Frederick J. Telecky, Jr.

(57) ABSTRACT

In accordance with one embodiment of the present invention, a memory array includes a plurality of memory cells, the memory cells each comprising one or more gates, and a word line for controlling the gates of the plurality of memory cells. A driver is coupled to the word line at a first location. The driver is operable to drive the gates of the memory cells. A load device is coupled to the word line at a second location remote from the first location. The load device is operable to pull a set of gates electrically isolated from the driver to a substantially non-floating state.

21 Claims, 2 Drawing Sheets

SYSTEM AND METHOD FOR PULLING ELECTRICALLY ISOLATED MEMORY CELLS IN A MEMORY ARRAY TO A NON-FLOATING STATE

TECHNICAL FIELD OF THE INVENTION

This invention relates generally to the field of integrated circuits, and more particularly to a system and method for pulling electrically isolated memory cells in a memory array to a non-floating state.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors, and other semiconductor devices. Typically, such devices are formed in and on a substrate and are interconnected to form an integrated circuit. Presently, there is a great demand for shrinking semiconductor devices to provide an increased density of devices on the semiconductor chip that are faster and consume less power. For memory devices, this has included using a low-resistance metal wordline in place of a higher resisting polysilicon wordline with metal strapping. Small defects or breaks in the connections can cause electrical leakage and other problems.

SUMMARY OF THE INVENTION

In accordance with one embodiment of the present invention, a memory array includes a plurality of memory cells, the memory cells each comprising one or more gates, and a word line for controlling the gates of the plurality of memory cells. A driver is coupled to the word line at a first location. The driver is operable to drive the gates of the memory cells. A load device is coupled to the word line at a second location remote from the first location. The load device is operable to pull a set of gates electrically isolated from the driver to a non-floating state.

Technical advantages of the present invention include providing an improved memory array. In particular, the reliability of the memory arrays using memory cells may be increased by reducing or eliminating the problems caused by floating memory cells. Electrically isolated memory cells are pulled to a non-floating state by a load device. The load device may be of relatively low cost and small size. The small size of the load device allows incorporation into existing technology with only minimal rework. In a particular embodiment, the load device may be incorporated into unused columns of memory cells at the periphery of each memory array.

Certain embodiments may possess none, one, some, or all of these technical features and advantages and/or additional technical features and advantages. Other technical advantages will be readily apparent to one skilled in the art from the following figures, description, and claims.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
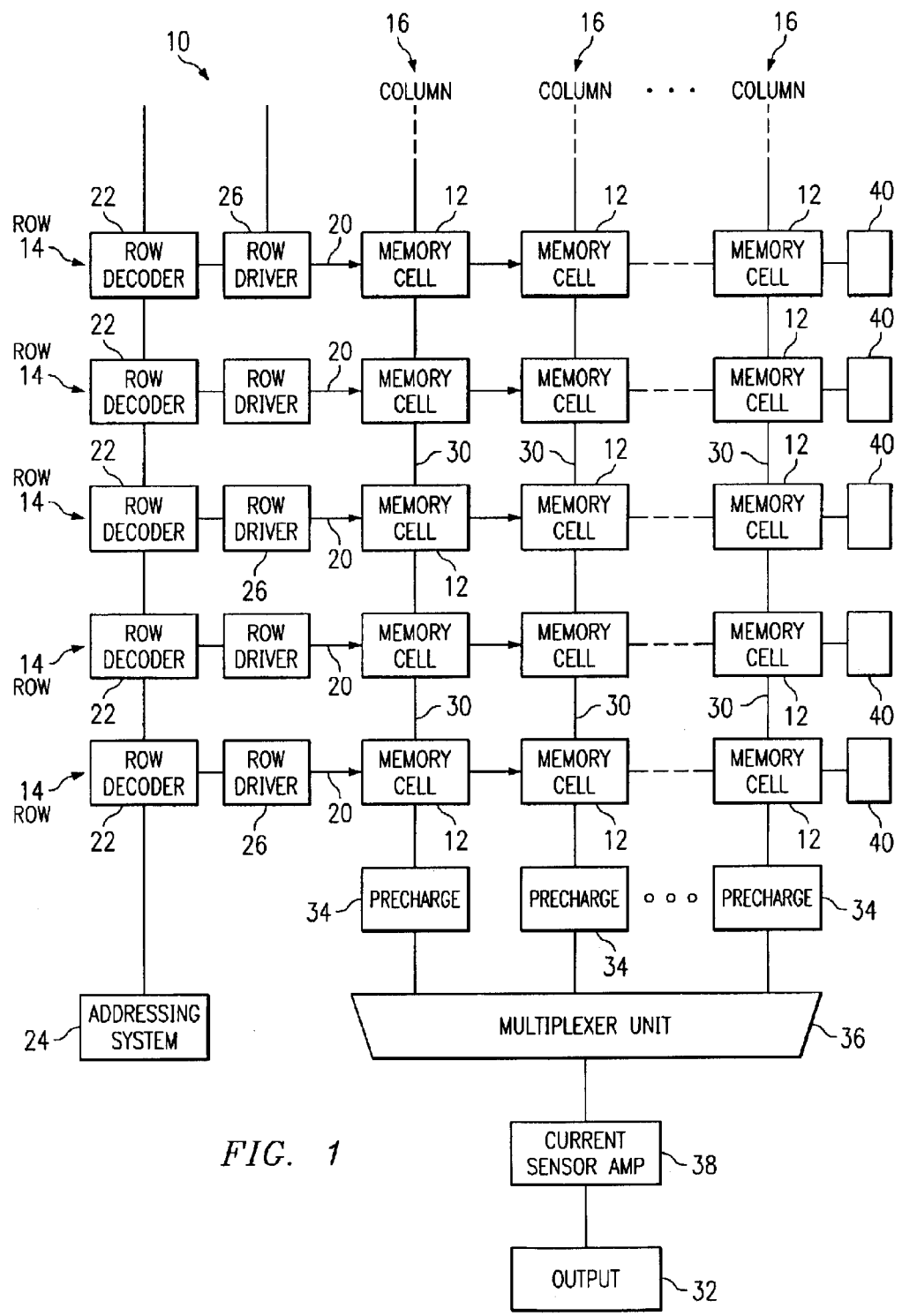
FIG. 1 is a block diagram illustrating a memory device in accordance with one embodiment of the present invention.

FIG. 1 illustrates a memory device 10 in accordance with one embodiment of the present invention. In this embodiment, the memory device 10 comprises a static random access memory (SRAM). In a particular embodiment, memory device 10 may comprise 6T SRAM array. It will be understood that the memory device 10 may comprise other types of memories without departing from the scope of the present invention. For example, the memory device 10 may comprise a dynamic random access memory (DRAM). The memory device may be directly or otherwise connected to a processor.

The memory device 10 may comprise an array of memory cells 12. As described in more detail below in connection with FIG. 2, memory cells 12 may comprise flip-flops or other arrangements of transistors or other suitable devices that allow information to be stored and retrieved.

Memory cells 12 may be arranged in a series of rows 14 and columns 16. In a particular embodiment, the array of memory cells may comprise 256 rows 14 and 128 columns 16. It will be understood that the memory device 10 may comprise another suitable number of rows 14 and columns 16. It will be further understood that the memory cells 12 may be otherwise disposed relative to one another without departing from the scope of the present invention.

Each row 14 of memory cells 12 may be connected and controlled by a word line 20. Word line 20 may be any type of connector capable of transmitting signals, and may be contiguous between adjacent memory cells 10. In one embodiment, word line 20 may comprise a metal film formed on a substrate in accordance with the conventional integrated circuit processing. In a particular embodiment, word lines 20 may comprise a metal 2 (MET 2) line. It will be understood that the line 20 may comprise other types or different metal levels in a stack or on top of other films formed on a substrate of conductors. In another embodiment, for example, word line 20 comprises a polysilicon word line wherein the word line is not strapped.

Word line 20 of each row 14 may be driven in accordance with conventional techniques. In one embodiment, a row decoder 22 may decode signals of an addressing system 24 and activate a row driver 26. The row decoder 22 and/or the addressing system 24 may comprise decoding logic.

The row driver 26 may drive the line 20 to access the memory cells of the memory cells 12. For writable memory such as RAM, the row driver 26 may also drive the line 20 to store data in the memory cells of the memory cells 12. It will be understood that the lines 20 may be otherwise suitably driven.

Each column 16 of memory cells 12 may be connected to an output 32 by a bit line 30. In one embodiment, the output 32 may be a line connected to a device utilizing the data of the memory device 10. It will be understood that the output 32 may be any type of device or a line of a device capable of using the data of the memory device 10. The bit line 30 may comprise one or more individual bit lines and may be any type of connector capable of transmitting signals. In one embodiment, the bit line 30 may comprise a metal or poly conductor formed on a substrate in accordance with the conventional integrated circuit processing. It will be understood that the bit line 30 may comprise other types of suitable conductors.

The memory cells along each bit line 30 may be independently accessed to provide data to the output 32 along bit line 30. A precharge 34, a multiplexer 36, and a current sensor amp 38 may be disposed between bit line 30 and output 32. The precharge 34 may precharge each line 30 of the memory device 10. Accordingly, data of a row of memory cells may be accessed by driving word line 20 of that row. As described in more detail below, the memory cells of the driven row may discharge or not depending upon their state.

Multiplexer unit 36 may comprise one or more multiplexers which may receive data from a plurality of bit lines 30 and construct a data word. In one embodiment, the data word constructed by a multiplexer may have 2 bits of data. It will be understood that the multiplexer may construct data words having other suitable numbers of bits. For example, in one embodiment, a multiplexer within the multiplexer unit 36 may construct data words of 8 bits, or one byte, each.

The data word formed by multiplexer unit 36 may be read by the current sensor amp 38. The product of the current sensor amp 38 may be passed to the output 32. It will be understood that the lines 30 may be otherwise switched, driven and/or read.

In a particular embodiment, a subset of rows 14 are redundant rows. The redundant rows may be used in place of a row 14 that has suffered a break or other discontinuity in the corresponding word line 20, or has otherwise been rendered inoperable or less than fully operable. Cells electrically isolated from their corresponding driver 26 may be said to be in a "floating" state. A floating state, as used herein, means a state wherein the gates of the memory cells are not held to a forced voltage level. Load devices 40 are coupled word line 20 in a location remote from the location of the driver 26. Each load device 40 may comprise a diode or other device operable to pull one or more memory cells to a non-floating state in the event that the cells have been electrically isolated from a corresponding driver 26 by the word line break or other discontinuity. A non-floating state, as used herein, means a state wherein the gates of the memory cells are substantially held to a forced voltage level, within about 100 mV of the desired state. Load devices are described in various embodiments in reference to FIGS. 3A–3C. "Remote," as used herein, means having at least one memory cell between the driver and the load device. In the illustrated embodiment, drivers 26 are at a first end of word line 20 and the load devices 40 are at the opposite, distal end of word line 20.

In an embodiment wherein memory device 10 comprises a NMOS device, load device 40 may comprise a pull-down device operable to pull the gates to a grounded state or a substantially grounded state. In an embodiment wherein memory device 10 comprises a PMOS device, load device 40 may comprise a pull-up device operable to pull the gates up to a selected voltage level.

Figure 2:
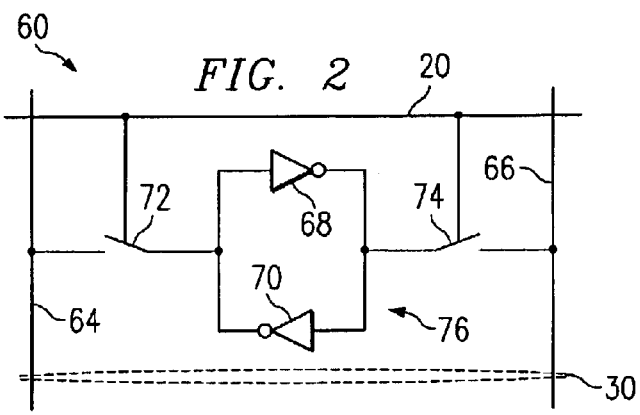
FIG. 2 is a block diagram illustrating details of the memory cell of FIG. 1 in accordance with one embodiment of the present invention.

FIG. 2 is a schematic diagram illustrating details of memory cell 12 in accordance with one embodiment of the present invention. In this embodiment, memory cells 12 comprise may comprise a metal oxide semiconductor formed in accordance with conventional integrated circuit processing techniques. It will be understood that the memory cells 12 may comprise other types of transistors or devices capable of storing data within the scope of the present invention.

Each memory cell 12 may comprise switches 72 and 74, and a latch 76 comprising inverters 68 and 70. The switches 72 and 74 may be connected to one of the word lines 20. In the illustrated embodiment, bit line 30 comprises bit line 64 and bit line bar 66. In one embodiment, the memory cell 12 can be accessed by driving the word lines 20 and bit lines 30 to which the switches 72 and 74 of memory cell 12 are connected. It will be understood that the memory cell 12 may be otherwise accessed within the scope of the present invention.

Figure 3A:
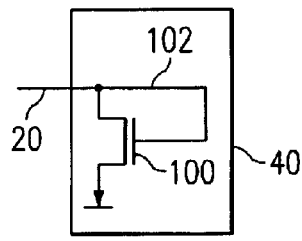
FIGS. 3A–C are block diagrams illustrating details of the load device of FIG. 1 in accordance with various embodiments of the present invention.
Figure 3B:
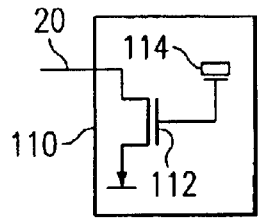
Figure 3C:
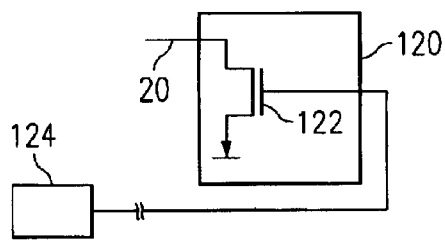

FIGS. 3A–C are block diagrams illustrating load devices in accordance with various embodiments of the present invention. In the illustrated embodiment, the load devices comprise pull-down devices operable to pull floating gates to a subtantially grounded state. "Substantially grounded" as used herein means within about 100 mV of ground.

In a first embodiment, illustrated in FIG. 3A, load device 40 comprises a transistor configured as a diode. Referring to FIG. 3A, drain charge may flow via connection 102 to activate gate 100, allowing the voltage from the word line to flow toward ground. In a particular embodiment, load device 40 may have a width-to-length ratio ("W/L") of about ½.

In a second embodiment, illustrated in FIG. 3B, load device 110 comprises a transistor coupled to a current source 114. Current from the current source 114 activates gate 112, allowing the voltage from the word line to flow toward ground. Current source 114 may comprise a word line driver or another suitable current source. In a particular embodiment, the current source may comprise a source with a current of about 50 micro amps. In a particular embodiment, load device 110 may have a W/L of about ⅑.

In a third embodiment, illustrated in FIG. 3C, load device 120 comprises a transistor coupled to a current source, as described above in reference to load device 110 of FIG. 1B. However, the current source of load device 120 is regulated by the addressing logic 124. In a particular embodiment, the addressing logic 124 may comprise redundant decoding logic. In a particular embodiment, load device 120 may have a W/L of about ⅕.

Figure 4:
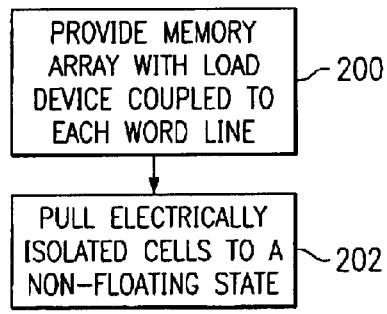
FIG. 4 is a flow chart illustrating a method for pulling electrically isolated memory cells in a memory array to a non-floating state in accordance with one embodiment of the present invention.

FIG. 4 is a flow chart illustrating a method for pulling electrically isolated memory cells in a memory array to a non-floating state in accordance with one embodiment of the present invention. The method begins with step 200 wherein a memory array comprising a plurality of memory cells is provided, with a load device coupled to each word line of the array. A driver may be coupled to a first location of the word line for driving the gates of the plurality of memory cells. The load device may be coupled to a second location of the word line remote from the first location.

Breaks or other discontinuities in one or more word lines may result in a set of memory cells becoming electrically isolated from their corresponding driver. At step 202, the load device pulls such electrically isolated cells to a non-floating state, as described above in reference to FIGS. 2 and 3A–3C.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A memory device, comprising:
   a plurality of memory cells, the memory cells each comprising one or more gates;
   a word line for controlling the gates of the plurality of memory cells;
   a driver coupled to the word line at a first location, the drivers operable to drive the gates of the plurality of memory cells; and
   a load device coupled to a second location of the word line remote from the first location, and operable to pull one or more of the plurality of memory cells electrically isolated from the driver to a non-floating state.

2. The memory device of claim 1, wherein the memory device is a static random-access memory device.

3. The integrated circuit of claim 1, wherein the word line comprises a metal film.

4. The integrated circuit of claim 1, wherein the load device comprises a diode.

5. The integrated circuit of claim 1, wherein the load device comprises a current source.

6. The integrated circuit of claim 5, wherein the operation of the current source is regulated by the addressing logic.

7. The integrated circuit of claim 1, wherein the load device is a pull-down device.

8. The integrated circuit of claim 1, wherein the load device is a pull-up device.

9. A method for pulling electrically isolated memory cells in a memory array to a non-floating state, comprising:
   providing a memory device, the memory device comprising:
      a plurality of memory cells, the memory cells each comprising one or more gates controlled by a word line;
      a driver coupled to a first location of the word line for driving the gates of the plurality of memory cells; and
      a load device coupled to a second location of the word line remote from the first location; and
   pulling with the load device one or more of the plurality of memory cells electrically isolated from the driver to a non-floating state.

10. The method of claim 9, wherein the load device comprises a diode.

11. The method of claim 9, wherein the load device comprises a current source.

12. The method of claim 11, wherein the operation of the current source is regulated by the addressing logic.

13. The method of claim 9, wherein the load device is a pull-down device.

14. The method of claim 9, wherein the load device is a pull-up device.

15. The method of claim 9, wherein the word line comprises a metal film.

16. A static random access memory device, comprising:
    a plurality of memory cells, the memory cells each comprising one or more gates;
    a word line comprising a metal film for controlling the gates of the plurality of memory cells;
    a driver coupled to a first location of the word line for driving the gates of the plurality of memory cells; and
    a load device coupled to a second location of the word line remote from the first location, and operable to pull one or more of the plurality of memory cells electrically isolated from the driver to a non-floating state.

17. The static random access memory device of claim 16, wherein the load device comprises a pull-down device.

18. The static random access memory device of claim 16, wherein the load device comprises a pull-up device.

19. The static random access memory device of claim 16, wherein the load device comprises a diode.

20. The static random access memory device of claim 16, wherein the load device comprises a current source.

21. The static random access memory device of claim 20, wherein the operation of the current source is regulated by the addressing logic.

* * * * *